(12) United States Patent
Cho et al.

(10) Patent No.: US 9,391,293 B2
(45) Date of Patent: Jul. 12, 2016

(54) ADHESIVE FILM

(71) Applicant: LG CHEM, LTD., Yeongdeungpo-gu (KR)

(72) Inventors: Yoon Gyung Cho, Daejeon (KR); Hyun Jee Yoo, Daejeon (KR); Seung Min Lee, Daejeon (KR); Suk Ky Chang, Daejeon (KR); Jung Sup Shim, Daejeon (KR)

(73) Assignee: LG Chem, Ltd., Seoul (KR)

( * ) Notice: Subject to any disclaimer, the term of this patent is extended or adjusted under 35 U.S.C. 154(b) by 0 days.

(21) Appl. No.: 14/142,347

(22) Filed: Dec. 27, 2013

(65) Prior Publication Data

US 2014/0110699 A1    Apr. 24, 2014

Related U.S. Application Data

(63) Continuation of application No. PCT/KR2012/009620, filed on Nov. 14, 2012.

(30) Foreign Application Priority Data

| Nov. 14, 2011 | (KR) | 10-2011-0118476 |
| Nov. 14, 2011 | (KR) | 10-2011-0118478 |
| Nov. 14, 2012 | (KR) | 10-2012-0128892 |
| Nov. 14, 2012 | (KR) | 10-2012-0129018 |

(51) Int. Cl.
*H01L 51/52* (2006.01)
*C09J 7/02* (2006.01)
*C09J 7/00* (2006.01)
*C08K 3/22* (2006.01)
(Continued)

(52) U.S. Cl.
CPC .............. *H01L 51/5246* (2013.01); *C09J 7/00* (2013.01); *C09J 7/02* (2013.01); *C09J 7/0203* (2013.01); *H01L 51/524* (2013.01); *H01L 51/5253* (2013.01); *C08K 3/0033* (2013.01); *C08K 3/22* (2013.01); *C08K 3/24* (2013.01); *C08K 3/32* (2013.01); *C08K 2003/2227* (2013.01); *C09J 2201/134* (2013.01); *C09J 2201/36* (2013.01); *C09J 2203/326* (2013.01); *C09J 2205/102* (2013.01); *C09J 2463/00* (2013.01); *H01L 51/5259* (2013.01); *Y10T 428/24942* (2015.01); *Y10T 428/24959* (2015.01)

(58) Field of Classification Search
USPC .......................................... 257/58, 59, 72, 40
See application file for complete search history.

(56) References Cited

U.S. PATENT DOCUMENTS

| 5,591,379 A | * | 1/1997 | Shores ................. C09K 3/1018 252/194 |
| 2005/0036090 A1 | * | 2/2005 | Hayashi .............. B81C 1/00269 349/122 |

(Continued)

FOREIGN PATENT DOCUMENTS

| CN | 101370889 A | 2/2009 |
| CN | 101867024 A | 10/2010 |

(Continued)

*Primary Examiner* — Cuong Q Nguyen
*Assistant Examiner* — Nishath Yasmeen
(74) *Attorney, Agent, or Firm* — Dentons US LLP

(57) ABSTRACT

An adhesive film used to encapsulate an organic electronic diode (OED) is provided. The adhesive film may be useful in effectively preventing penetration of moisture into an encapsulated structure of the organic electronic diode when the organic electronic diode is encapsulated, and effectively performing the encapsulation process under moderate conditions without causing damage to the organic electronic diode during the encapsulation process.

22 Claims, 5 Drawing Sheets

(51) Int. Cl.
*C08K 3/00* (2006.01)
*C08K 3/24* (2006.01)
*C08K 3/32* (2006.01)

(56) References Cited

U.S. PATENT DOCUMENTS

| | | |
|---|---|---|
| 2009/0026934 A1 | 1/2009 | Fujita et al. |
| 2010/0140556 A1* | 6/2010 | Kojima ................. H05K 3/323 252/500 |
| 2011/0025196 A1* | 2/2011 | Rakuff ................ H01L 51/5237 313/504 |
| 2011/0157540 A1* | 6/2011 | Jung ...................... G02B 5/305 349/194 |
| 2011/0210407 A1 | 9/2011 | Katayama et al. |

FOREIGN PATENT DOCUMENTS

| | | |
|---|---|---|
| EP | 2637229 A2 | 9/2013 |
| JP | 2004265776 A | 9/2004 |
| JP | 2005200521 A | 7/2005 |
| JP | 2009007443 A | 1/2009 |
| JP | 200990633 A | 4/2009 |
| JP | 2009-283279 A | 12/2009 |
| KR | 10-2007-0116969 A | 12/2007 |
| KR | 1020090014475 A | 2/2009 |
| KR | 1020100028660 A | 3/2010 |
| KR | 1020110036961 A | 4/2011 |
| TW | 201012648 A1 | 4/2010 |
| WO | 2011016408 A1 | 2/2011 |

* cited by examiner

ADHESIVE FILM

This application is a Continuation Bypass Application of International Patent Application No. PCT/KR2012/009620, filed Nov. 14, 2012, which claims priority to and the benefit of Korean Patent Application Nos. 10-2011-0118478 filed on Nov. 14, 2011; 10-2011-0118476, filed Nov. 14, 2011; 10-2012-0128892, filed Nov. 14, 2012 and 10-2012-0129018, filed Nov. 14, 2012 in the Korean Intellectual Property Office, all of which are hereby incorporated by reference in their entirety.

FIELD

The present invention relates to an adhesive film and a method of encapsulating an organic electronic device using the same.

BACKGROUND

An organic electronic device (OED) means a product or device including at least one organic material layer in which charge transfer occurs using holes and electrons. In general, the organic electronic device may include a photovoltaic device, an organic light emitting diode (OLED), a rectifier and a transmitter.

Compared to conventional light sources, organic light emitting diode (OLED) s have low power consumption, rapid response time, and can be easily made into a thin display device or lighting. Also, organic light emitting diodes have excellent space utilization, and thus are expected to be applicable in various fields including all kinds of portable devices, monitors, notebook computers and TVs.

To encapsulate an organic light emitting diode formed on a substrate formed of glass or a polymer film, a method of laminating a part of a glass or metal can on the substrate using an adhesive has been used in a conventional organic light emitting device. Here, the glass or metal can is made into a cap that has a groove holding a getter or a moisture absorbent. In such a configuration, the glass or metal has a cavity or protrusion having a predetermined depth required to hold the getter or moisture absorbent. Also, the glass severely degrades the overall impact resistance of a device since it is vulnerable to mechanical impact. Also, the use of the metal makes it difficult to secure processability required to manufacture a large-scale device. Moreover, in an organic light emitting device having a conventional configuration, the cavity inhibits heat dissipation so that heat generated during driving of a display device gets concentrated in the center, becoming a serious problem when the device is scaled up. Further, top emission, which can enhance light efficiency, is impossible.

PRIOR-ART PATENT DOCUMENTS

Patent Document 1: U.S. Pat. No. 6,226,890
Patent Document 2: U.S. Pat. No. 6,808,828
Patent Document 3: Japanese Laid-open Publication No. 2000-145627
Patent Document 4: Japanese Laid-open Publication No. 2001-252505

SUMMARY

The present invention is directed to providing an adhesive film, an organic electronic device using the same, and a method of encapsulating the organic electronic device.

One aspect of the present invention provides an adhesive film. One illustrative adhesive film may include a multi-layered adhesive layer. For example, the adhesive film may include a first adhesive layer including a moisture-absorbent filler and a second adhesive layer which does not include the moisture-absorbent filler.

According to one exemplary embodiment, the adhesive film as used herein may be used to encapsulate an organic electronic diode (OED). According to one exemplary embodiment, the adhesive film is attached to the entire surface of the OED without a gap, and thus may be used to encapsulate the organic electronic diode. An adhesive layer of the adhesive film brought into direct contact with and attached to the organic electronic diode as used herein is a second adhesive layer, and the first adhesive layer is an adhesive layer which is not brought into contact with the organic electronic diode during encapsulation of the organic electronic diode.

The term "organic electronic diode" or "OED" refers to a product or diode including at least one organic material layer in which charge transfer occurs between a pair of facing electrodes using holes and electrons. Here, specific embodiments of the organic electronic diode include a photovoltaic device, a rectifier, a transmitter and an organic light emitting diode (OLED), but the present invention is not limited thereto. According to one exemplary embodiment, the organic electronic diode may be an organic light emitting diode.

Another exemplary embodiment of the present invention is directed to providing an organic electronic device. One illustrative organic electronic device may include an organic electronic diode encapsulated with the adhesive film. According to one exemplary embodiment, in the adhesive film, the second adhesive layer, that is, an adhesive layer which does not include a moisture-absorbent filler, may be present and attached to the entire surface of the organic electronic diode. Also, the first adhesive layer, that is, an adhesive layer including the moisture-absorbent filler, may be present in a position in which the adhesive layer is not brought into contact with the organic electronic diode.

Also, still another exemplary embodiment of the present invention is directed to providing a method of encapsulating an organic electronic device. The method includes applying an adhesive film to a substrate having an organic electronic diode formed thereon so that a second adhesive layer of the adhesive film can be attached to an entire surface of the organic electronic diode; and curing the adhesive film.

Effect

The adhesive film according to the exemplary embodiments of the present invention may be, for example, used to encapsulate an organic electronic device.

Figure 1:
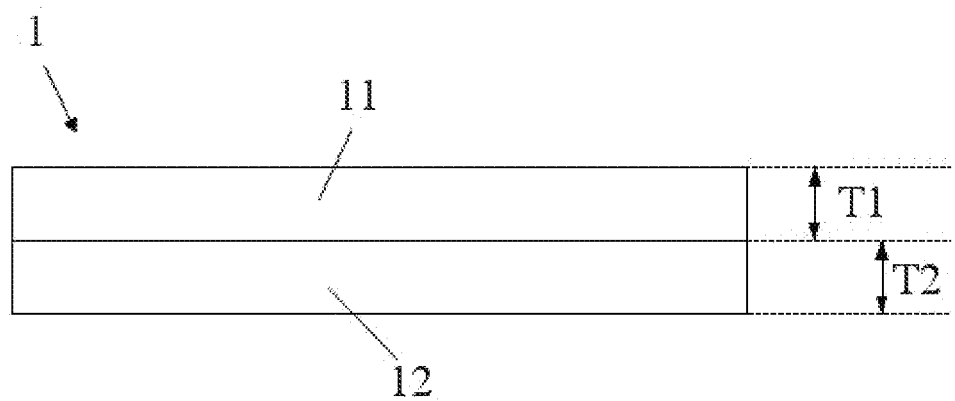
FIGS. 1 to 3 are diagrams showing one illustrative adhesive film.

DESCRIPTION OF REFERENCE NUMERALS 1, 2, 3, 4, 5: adhesive film
11, 12, 21, 31, 32: adhesive layer
41, 51: base or release film
T1: thickness of first adhesive layer
T2: thickness of second adhesive layer
6: organic electronic device
61, 62: substrate
63: organic electronic device

DETAILED DESCRIPTION OF EXEMPLARY EMBODIMENTS

With reference to the appended drawings, exemplary embodiments of the present invention will be described in detail below. To aid in understanding the present invention, like numbers refer to like elements throughout the description of the figures, and the description of the same elements will be not reiterated.

The adhesive film according to one exemplary embodiment of the present invention is used to encapsulate an organic electronic diode (OED). The term "organic electronic diode" or "OED" refers to a product or diode having a structure including at least one organic material layer in which charge transfer occurs between a pair of facing electrodes using holes and electrons. Here, embodiments of the organic electronic diode may include a photovoltaic device, a rectifier, a transmitter and an organic light emitting diode (OLED), but the present invention is not limited thereto. According to one exemplary embodiment of the present invention, the organic electronic diode may be an organic light emitting diode.

One illustrative adhesive film has a multi-layered structure including two or more adhesive layers. Here, at least one of the two or more adhesive layers may include a moisture-absorbent filler, and the other one of the two or more adhesive layers does not include the moisture-absorbent filler.

That is, according to one exemplary embodiment, the adhesive film may include a first adhesive layer including a moisture-absorbent filler and a second adhesive layer which does not include the moisture-absorbent filler.

According to one exemplary embodiment, the adhesive film may be attached to an entire surface of the organic electronic diode without a gap, that is, directly attached to the entire surface of the organic electronic diode, and used to encapsulate the organic electronic diode. In this case, the second adhesive layer of the adhesive film which does not include the moisture-absorbent filler may be brought into direct contact with the organic electronic diode, and the first adhesive layer including the moisture-absorbent filler may be applied so that the first adhesive layer is not brought into contact with the organic electronic diode during the encapsulation of the organic electronic diode.

FIG. 1 is a schematic diagram showing the adhesive film. As shown in FIG. 1, the adhesive film 1 includes at least a first adhesive layer 11 and a second adhesive layer 12. According to one exemplary embodiment, the first and second adhesive layers 11 and 12 may be arranged so that they can be sequentially stacked one upon the other. In this case, a ratio T1/T2 of a thickness (T2 as shown in FIG. 1) of the second adhesive layer 12 to a thickness (T1 as shown in FIG. 1) of the first adhesive layer 11 may be in a range from 1 to 10. According to various exemplary embodiments, the upper limit of the ratio T1/T2 may be approximately 50, 45, 40, 35, 30, 25, 20, 15, 10, 5 or 3. Also, the lower limit of the ratio T1/T2 may be, for example, 0.1, 0.5, 1.0, 1.5, 2.0, 2.5, 3.0, 3.5, 4.0 or 4.5.

When the adhesive film is used to encapsulate an organic electronic device, for example, by adjusting the ratio T1/T2 of the thickness of the second adhesive layer to the thickness of the first adhesive layer to the above-described range, penetration of moisture into the encapsulated structure after encapsulation of the OED may be effectively prevented. Also, the encapsulated structure may be endowed with excellent durability and long-term lifespan characteristics. In addition, an encapsulation process may be effectively performed even under moderate conditions within the ratio T1/T2 range.

According to exemplary embodiments of the present invention, the first adhesive layer may have a thickness of 5 μm or more, 10 μm or more, 15 μm or more, 20 μm or more, 25 μm or more, or 30 μm or more. As the thickness of the first adhesive layer increases, moisture which penetrates into a diode after the encapsulation of the organic electronic diode may be effectively absorbed or removed. Therefore, the upper limit of the thickness is not particularly limited. However, when the thickness of the first adhesive layer is excessively large, a lamination property of the adhesive film may be degraded during an encapsulation process. In consideration of this fact, the upper limit of the thickness may be properly selected. According to one exemplary embodiment, the upper limit of the thickness may be, for example, 100 μm or less, 90 μm or less, 80 μm or less, 70 μm or less, 60 μm or less, 50 μm or less, 40 μm or less, 30 μm or less, or 20 μm or less.

The thickness of the second adhesive layer may be the same as or greater than the maximum average diameter of the moisture-absorbent filler included in the first adhesive layer. When the thickness of the second adhesive layer is too thin, damage to the organic electronic diode may be caused during the encapsulation process. In consideration of this fact, the thickness of the second adhesive layer may be properly selected. The average diameter of the moisture-absorbent filler is generally in a range of approximately 3 μm to 4 μm. Therefore, the second adhesive layer may have a thickness of 3 μm or more, 4 μm or more, 5 μm or more, 6 μm or more, or 7 μm or more. Also, the upper limit of the thickness of the second adhesive layer may be, for example, 20 μm or less, 15 μm or less, or 10 μm or less.

As such, the sum of the thicknesses of the adhesive layers in the adhesive film including at least the first and second adhesive layers may be, for example, 8 μm or more, 10 μm or more, 15 μm or more, 20 μm or more, 25 μm or more, or 30 μm or more. Also, the upper limit of the sum of the thicknesses may be, for example, 100 μm or less, 90 μm or less, 80 μm or less, 70 μm or less, 60 μm or less, 50 μm or less, 45 μm or less, 40 μm or less, 35 μm or less, or 30 μm or less. When the sum of the thicknesses of the adhesive layers is less than 8 μm, the adhesive film does not serve to compensate for physical damage caused by the moisture-absorbent filler or the other particles. On the other hand, when the sum of the thicknesses of the adhesive layers exceeds 100 μm, the moisture barrier characteristics may be degraded. In particular, a lamination property may be deteriorated since an adhesive may severely exude out during a lamination process The adhesive film as used herein may further include another adhesive layer as long as the adhesive layer includes at least the first and second adhesive layers.

According to another exemplary embodiment of the present invention, the adhesive film may further include one or more adhesive layers including a moisture-absorbent filler or one or more adhesive layers which do not include the moisture-absorbent filler. That is, the adhesive film may further include one or both of the one or more adhesive layers including a moisture-absorbent filler and one or more adhesive layers which do not include the moisture-absorbent filler.

Figure 2:
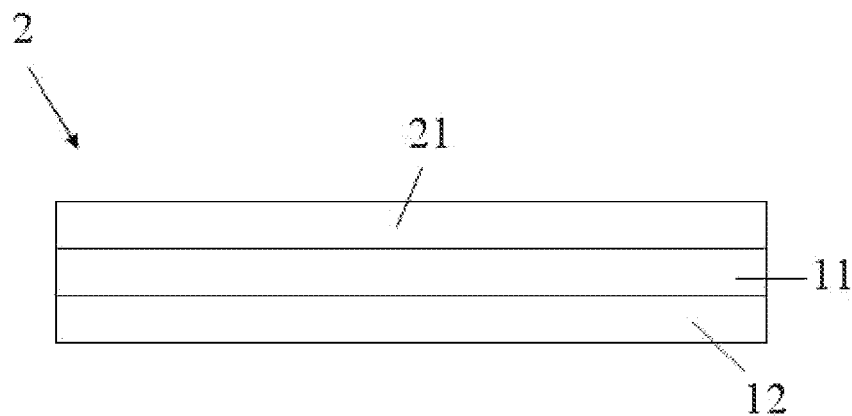

According to one exemplary embodiment, the adhesive film 2 may include an adhesive layer having a structure in which the second adhesive layer 12, the first adhesive layer 11 and a third adhesive layer 21 are sequentially stacked as shown in FIG. 2. In this case, the third adhesive layer 21 may be an adhesive layer which does not include the moisture-absorbent filler.

Figure 3:
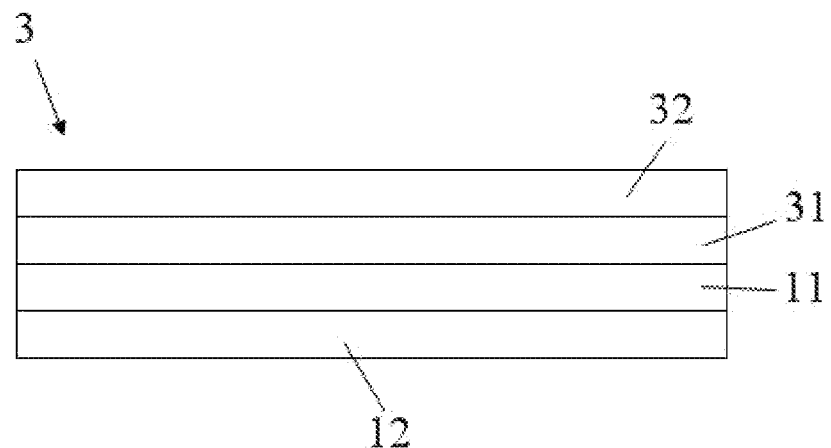

According to another exemplary embodiment, the adhesive film 3 may include an adhesive layer having a structure in which the second adhesive layer 12, the first adhesive layer 11, a third adhesive layer 31 and a fourth adhesive layer 32 are sequentially stacked as shown in FIG. 3. In this case, the third adhesive layer 31 may be an adhesive layer which does not include a moisture-absorbent filler, and the fourth adhesive layer 32 may be an adhesive layer including the moisture-absorbent filler, and vice versa.

In addition to the structure as shown in FIGS. 2 and 3, the adhesive film may be formed in various different structures. In this case, the ratio T3/T4 of the sum T3 of the thicknesses of the adhesive layers which do not include the moisture-absorbent filler to the sum T4 of the thicknesses of the adhesive layers including the moisture-absorbent filler has to satisfy the thickness ratio T1/T2.

That is, when the adhesive film includes another adhesive layer including the moisture-absorbent filler in addition to the first adhesive layer, the thickness of the first adhesive layer in the above-described thickness ratio or the thickness of the first adhesive layer itself may be, for example, the sum of the thicknesses of all the adhesive layers including the moisture-absorbent filler.

According to one exemplary embodiment, when the adhesive film has a multi-layered structure including two or more layers, an adhesive layer which does not include the moisture-absorbent filler may be arranged on the lowermost layer of the adhesive layers. According to another exemplary embodiment, when the adhesive film has a multi-layered structure three or more layers, adhesive layers which do not include the moisture-absorbent filler may also be arranged on the lowermost and uppermost layers of the adhesive layers, respectively. According to another exemplary embodiment, when the adhesive film has a multi-layered structure of four or more layers, an adhesive layer including the moisture-absorbent filler and an adhesive layer which does not include the moisture-absorbent filler may be alternately formed to be stacked in sequence.

Specific kinds of an adhesive composition used to form the first or second adhesive layer or form another adhesive layer in addition to the first and second adhesive layer are not particularly limited.

According to one exemplary embodiment, the adhesive layer as used herein may be formed using a curable hot-melt adhesive composition including at least one kind of a curable resin. In this document, the term "curable hot-melt adhesive composition" may refer to an adhesive that is maintained in a solid or semi-solid state at room temperature and melted by heat to show pressure-sensitive adhesivity, and may serve as an adhesive to strongly fix a target product when cured.

For example, the adhesive film according to one exemplary embodiment of the present invention may have a viscosity at room temperature of $10^6$ Pa·s or more, or $10^7$ Pa·s or more. The term "room temperature" refers to a natural temperature that is neither increased nor decreased, for example, a temperature of approximately 15° C. to 35° C., approximately 20° C. to 25° C., or approximately 25° C. The viscosity as used herein may be measured using an advanced rheometric expansion system (ARES). Physical or chemical damage to a device caused by curing of a resin in an encapsulation process may be prevented by adjusting the viscosity of the curable hot-melt adhesive to a level as described above, and the process may be smoothly performed, and a flat panel having a uniform thickness may be encapsulated.

The upper limit of the viscosity of the adhesive film, particularly an adhesive layer of the adhesive film, is not particularly limited as long as the adhesive film is maintained in a solid or semi-solid state at room temperature. For example, the viscosity of the adhesive film may be controlled within a range of approximately $10^9$ Pa·s or less in consideration of processability.

Figure 4:
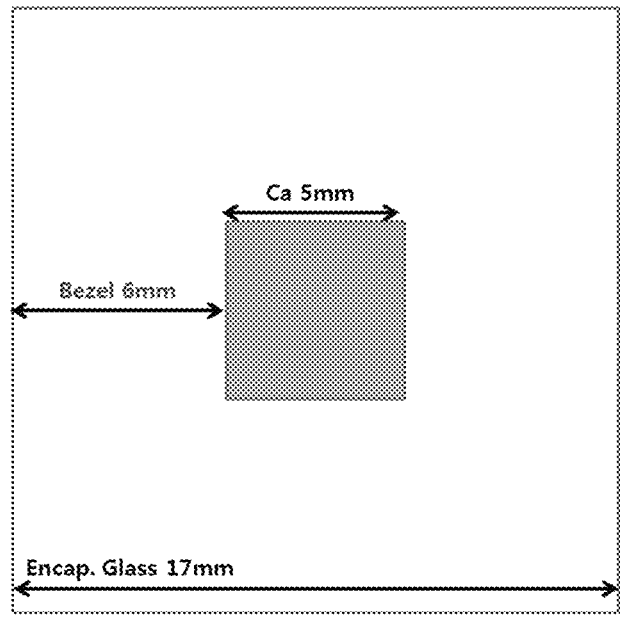
FIG. 4 is a concept diagram showing a calcium test to evaluate the moisture barrier characteristics of an adhesive film.

The moisture barrier characteristics of the adhesive film as used herein may be, for example, evaluated using a calcium test. The adhesive film may be easily discolored due to a reaction of calcium (C) with moisture. As a result, when the adhesive film is exposed to high temperature/humidity conditions for the same period of time, the adhesive film shows better moisture barrier performance as calcium is less damaged. In the calcium test, an ideal value is 6 mm which is a thickness of an adhesive film which copes with water penetration when the adhesive film is kept for 1,000 hours under the high temperature/humidity conditions (85° C., and 85% relative humidity). As shown in FIG. 4, the calcium test may be performed, for example, by thermally laminating an adhesive film onto an upper glass panel having a size of 17 mm×17 mm, depositing calcium on a lower glass panel at a size of 5 mm×5 mm, laminating the prepared upper glass panel onto the lower glass panel, thermally curing the laminated sample, and checking a moisture penetration depth with time under a microscope, but the present invention is not limited thereto.

In general, a flow or exudation level of an adhesive appears at a lamination temperature during assembly of a panel. In this case, when the adhesive film in an uncured state is laminated onto an adherend at a temperature of 50° C. to 100° C., an exudation level of an adhesive in the adhesive layer may be 1 mm or less from an original position. Also, the difference in viscosity between the first adhesive layer and the second adhesive layer in uncured states at a temperature of 30° C. to 130° C. may be 100 Pa·s or less, or 70 Pa·s or less, 50 Pa·s or less, 20 Pa·s or less, or 10 Pa·s or less. In the first adhesive layer and the second adhesive layer, the viscosity of an upper or lower layer may be relatively higher or lower. Typically, the difference in viscosity between adhesive sublayers may be 0 Pa·s.

As such, when the difference in viscosity between the first adhesive layer and the second adhesive layer in uncured states at a temperature of 30° C. to 130° C. is 100 Pa·s or less, preferably 50 Pa·s or less, reliability may be ensured due to the small difference in flow or exudation level of each adhesive layer during a lamination process. As described above, when the difference in viscosity between the first adhesive layer and the second adhesive layer in uncured states at a temperature of 30° C. to 130° C. is relatively low, the difference in flow or exudation level of each adhesive sublayer during a lamination process may be in a range of 0 μm to 300 μm. In this case, the typical lamination process is performed by thermally laminating the adhesive film onto an adherend at a temperature of 50° C. to 100° C. and a variable pressure, but the present invention is not limited thereto. For example, the lamination may be performed at a pressure of 0.05 MPa to 5 MPa. As described above, the flow level of the adhesive may be controlled by controlling the viscosity of the adhesive layer in an uncured state in a heating temperature range. Therefore, reliability may be ensured when the adhesive layer is applied to the lamination process.

The viscosities of the first adhesive layer and the second adhesive layer may be adjusted by changing components or altering the content ratio of the components, the content of an additive, the kind or particle size of a moisture absorbent or filler, or the conditions required to manufacture an adhesive film.

Specific kinds of curable resins that may be used according to exemplary embodiments of the present invention are not particularly limited. For example, various curable resins, such as thermosetting resins, photocurable resins or dual-curable resins, known in the related art may be used. The term "thermosetting resin" refers to a resin that can be cured by proper application of heat or an aging process, the term "photocurable resin" refers to a resin that can be cured by irradiation with electromagnetic waves, and the term "dual-curable resin" refers to a resin that has the characteristics of both the thermosetting resin and the photocurable resin and thus can be cured by irradiation with electromagnetic waves and application of heat. As described above, a category of the electromagnetic waves may include particle beams such as alpha-particle beams, proton beams, neutron beams and electron beams, and also microwaves, infrared rays (IR), ultraviolet rays (UV), X rays and gamma rays. One embodiment of the photocurable resin may be a cationic photocurable resin. The cationic photocurable resin refers to a resin that can be cured by a cationic polymerization or cationic curing reaction induced by irradiation with electromagnetic waves.

Specific kinds of curable resins are not particularly limited as long as they show the above-described characteristics. For example, the curable resin may include resins that are cured to show the adhesive characteristics, for example, a resin containing at least one thermally curable functional group such as a glycidyl group, an isocyanate group, a hydroxyl group, a carboxyl group or an amide group, or a resin containing at least one functional group that can be cured by irradiation with electromagnetic waves, such as an epoxide group, a cyclic ether group, a sulfide group, an acetal group or a lactone group. Also, specific kinds of the resin may include an acrylic resin, a polyester resin, an isocyanate resin or an epoxy resin, but the present invention is not limited thereto.

An aromatic or aliphatic resin or a linear or branched epoxy resin may be used as the curable resin. According to one exemplary embodiment, an epoxy resin containing at least two functional groups and having an epoxy equivalent weight of 180 g/eq to 1,000 g/eq may be used. When the epoxy resin has the above-described epoxy equivalent weight, the epoxy resin may be used to effectively maintain characteristics such as adhesive performance and glass transition temperature of a cured product. Embodiments of such an epoxy resin may include a cresol novolac epoxy resin, a bisphenol A epoxy resin, a bisphenol A novolac epoxy resin, a phenol novolac epoxy resin, a tetrafunctional epoxy resin, a biphenyl-type epoxy resin, a triphenolmethanetype epoxy resin, an alkyl-modified triphenolmethane epoxy resin, a naphthalene-type epoxy resin, a dicyclopentadiene-type epoxy resin or a dicyclopentadiene-modified phenol-type epoxy resin, which may be used alone or in combination.

According to one exemplary embodiment, an epoxy resin having a circular structure in the molecular structure thereof may be used as the curable resin. For example, an epoxy resin containing an aromatic group such as a phenyl group may be used. When the epoxy resin contains an aromatic group, a cured product may have excellent thermal and chemical stability and low moisture absorption, thereby improving the reliability of an encapsulated structure of an organic electronic device. Specific embodiments of the aromatic group-containing epoxy resin may include, but are not limited to, a biphenyl-type epoxy resin, a dicyclopentadiene-type epoxy resin, a naphthalene-type epoxy resin, a dicyclopentadiene-modified phenol-type epoxy resin, a cresol-based epoxy resin, a bisphenol-based epoxy resin, an xyloc-based epoxy resin, a multi-functional epoxy resin, a phenol novolac epoxy resin, a triphenolmethane-type epoxy resin and an alkyl-modified triphenolmethane epoxy resin, which may be used alone or in combination.

According to another exemplary embodiment, a silane-modified epoxy resin, for example, a silane-modified epoxy resin containing an aromatic group, may be used as the epoxy resin. When an epoxy resin that is structurally modified with silane to have a silyl group as described above is used, the adhesivity to a glass substrate or inorganic materials of the inorganic material in the organic electronic device may be maximized, and the moisture barrier property, durability and reliability may also be improved. Specific kinds of the epoxy resin as used herein are not particularly limited. Various kinds of epoxy resins known in the related art may be used as long as they satisfy the above-described characteristics such as water vapor transmission rate (WVTR).

The adhesive layer including a moisture-absorbent filler such as the first adhesive layer includes a moisture-absorbent filler in addition to the curable resin. The term "moisture-absorbent filler" may be generally used to mean inclusion of all kinds of components capable of absorbing or removing moisture or water, which is flowing in from the outside, by a chemical reaction with moisture. Here, the moisture-absorbent filler may be referred to as a reactive moisture absorbent.

The moisture-absorbent filler chemically reacts with water, moisture or oxygen flowing in the adhesive layer to absorb moisture or water. Specific kinds of moisture-absorbent fillers that may be used according to exemplary embodiments of the present invention are not particularly limited, and may, for example, include a metal powder such as alumina, a metal oxide, an organic metal oxide, a metal salt or phosphorus pentoxide ($P_2O_5$), which may be used alone or in combination.

Specific examples of the metal oxide as used herein may include lithium oxide ($Li_2O$), sodium oxide ($Na_2O$), barium oxide (BaO), calcium oxide (CaO) or magnesium oxide (MgO), examples of the metal salt may include a sulfate such as lithium sulfate ($Li_2SO_4$), sodium sulfate ($Na_2SO_4$), calcium sulfate ($CaSO_4$), magnesium sulfate ($MgSO_4$), cobalt sulfate ($CoSO_4$), gallium sulfate ($Ga_2(SO_4)_3$), titanium sulfate ($Ti(SO_4)_2$) or nickel sulfate ($NiSO_4$), a metal halide such as calcium chloride ($CaCl_2$), magnesium chloride ($MgCl_2$), strontium chloride ($SrCl_2$), yttrium chloride ($YCl_3$), copper chloride ($CuCl_2$), cesium chloride (CsF), tantalum chloride ($TaF_5$), niobium chloride ($NbF_5$), lithium chloride (LiBr), calcium bromide ($CaBr_2$), cesium bromide ($CeBr_3$), selenium bromide ($SeBr_4$), vanadium bromide ($VBr_3$), magnesium bromide ($MgBr_2$), barium iodide ($BaI_2$) or magnesium iodide ($MgI_2$), or a metal chlorate such as barium perchlorate ($Ba(ClO_4)_2$) or magnesium perchlorate ($Mg(ClO_4)_2$), but the present invention is not limited thereto.

According to one exemplary embodiment of the present invention, the moisture-absorbent filler such as a metal oxide as used herein may be properly processed and then blended with a composition. For example, the adhesive layer may be a thin film having a total thickness of 30 μm or less, depending on the kind of an organic electronic device to which the adhesive film is applicable. In this case, a process for milling a moisture-absorbent filler may be required. Here, the moisture-absorbent filler may be milled using a method such as three-roll milling, bead milling or ball milling. Also, when the adhesive film is used in a top emission-type organic electronic device, the transmissivity of the adhesive layer itself is a very important factor. Therefore, it is necessary to reduce the size of the moisture-absorbent filler. In this aspect, a milling process may be required for these applications.

The adhesive layer may include the moisture-absorbent filler at a content of 5 to 50 parts by weight, or 10 to 30 parts by weight, relative to 100 parts by weight of the curable resin. When the moisture-absorbent filler is controlled within this content range, the moisture barrier characteristics may be maximized without causing damage to an organic electronic diode.

Unless particularly stated otherwise in this document, the unit "part(s) by weight" means a weight ratio between respective components.

The moisture-absorbent filler may be homogeneously dispersed in the adhesive layer of the adhesive film.

The adhesive layer of the adhesive film according to one exemplary embodiment of the present invention may include a (non-absorbent) filler, for example, an inorganic filler, rather than the moisture-absorbent filler, regardless of the fact that the adhesive layer includes the moisture-absorbent filler. The (non-absorbent) filler may inhibit penetration of moisture or water by extending a moisture or water traveling path through which moisture or water penetrates through an encapsulated structure, and the barrier property to moisture and water may be maximized by interaction with a matrix structure of the curable resin. At the same time, the durability, such as mechanical strength, of the adhesive film may be improved.

Specific kinds of (non-absorbent) fillers that may be used according to exemplary embodiments of the present invention are not particularly limited. For example, the (non-absorbent) filler that may be used herein may include clay, talc, silica, barium sulfate, aluminum hydroxide, calcium carbonate, magnesium carbonate, zeolite, zirconia, titania or montmorillonite, which may be used alone or in combination.

To enhance the binding efficiency between the filler and the curable resin, a product whose surface is treated with an organic material may be used as the filler, or a coupling agent may be further added to the curable resin.

The adhesive layer may include the filler at a content of 3 to 50 parts by weight, or 5 to 30 parts by weight, relative to 100 parts by weight of the curable resin. When the content of the filler is controlled to more than 3 parts by weight, a cured product having excellent moisture or water barrier property and mechanical property may be provided. Also, when the content of the filler is controlled to less than 50 parts by weight, the adhesive layer may be manufactured in the form of a film. When the adhesive layer is formed into a thin film, a cured product having adhesive characteristics may also be provided.

Also, the adhesive composition may further include a curing agent capable of forming a matrix such as cross-linking structure by a reaction with a curable resin according to the kind of the curable resin, or an initiator capable of initiating a curing reaction of a resin, for example, a cationic photopolymerization initiator.

Specific kinds of the curing agent au used herein are not particularly limited and may be properly selected according to the kind of the curable resin or functional group included in the curable resin. For example, when the epoxy resin is used as the curable resin, a typical curing agent for epoxy resins known in the related art may be used as the curing agent. More specifically, various kinds of an amine-based compound, an imidazole-based compound, a phenol-based compound, a phosphorus-based compound or an acid anhydride-based compound may be used alone or in combination, but the present invention is not limited thereto.

The content of the curing agent included in the adhesive composition may be selected according to the components in the composition and the contents thereof. For example, the curing agent may be included at a content of 1 to 20 parts by weight, or 1 to 10 parts by weight, relative to 100 parts by weight of the curable resin. However, the content of the curing agent is just one exemplary embodiment. That is, the content of the curing agent may vary according to the kind and content of the curable resin or the functional group in the curable resin, or the matrix structure or cross-linking density to be realized.

Also, the kind of the initiator, for example, the cationic polymerization initiator, is not particularly limited. For example, a known cationic polymerization initiator such as aromatic diazonium salt, aromatic aluminum iodate, aromatic sulfonium salt or an iron-arene complex may be used. Among these, the aromatic sulfonium salt may be used, but the present invention is not limited thereto.

In this case, the content of the initiator may be, for example, in a range of 0.01 to 10 parts by weight, or 0.1 to 3 parts by weight, relative to 100 parts by weight of the curable resin. When the content of the initiator is too low, a curing process may not be sufficiently performed. On the other hand, when the content of the initiator is too high, the durability of an adhesive may be degraded due to an increase in content of an ionic material after the curing process, or the optical durability may be degraded due to formation of a conjugate acid, which is characteristic of the initiator. Also, corrosion may take place according to a base used. Therefore, the content of the initiator may be properly selected in consideration of this fact.

Also, the adhesive composition may further include a binder resin. The binder resin may serve to improve moldability when the composition is formed into a film or sheet. Also the binder resin may serve as a high-temperature viscosity controlling agent configured to adjust flowability during a hot-melting process.

Kinds of binder resins are not particularly limited as long as they have compatibility with another component such as a curable resin. Specific examples of the binder resin may include, but are not limited to, a phenoxy resin, an acrylate resin, a polymeric epoxy resin having a weight average molecular weight of 20,000, an ultra-polymeric epoxy resin, a high-polarity functional group-containing rubber and a high-polarity functional group-containing reactive rubber, which may be used alone or in combination.

When the binder resin is included in the adhesive composition, the content of the binder resin may be adjusted according to desired physical properties, but the present invention is not particularly limited thereto. For example, the binder resin may be included at a content of approximately 10 to 200 parts by weight, 20 to 150 parts by weight, or approximately 30 to 100 parts by weight, relative to 100 parts by weight of the curable resin. When the binder resin is controlled to a content of 10 to 200 parts by weight, the binder resin may effectively maintain compatibility with each of the components of the resin composition, and may serve as an adhesive. When the content of the binder is too low, a resin may exude during a lamination process due to the low viscosity, or a high pressure sensitive adhesive strength at room temperature may lead to difficulty in adjusting a release force. On the other hand, when the content of the binder is too high, a lamination property may be poor. Therefore, the viscosity of each layer may be adjusted by adjusting the content of the binder resin, and thus the difference in viscosity between the layers may be lowered to ensure optimal processability and physical properties.

In addition, the adhesive composition may further include a filler so as to improve the durability of a cured product, or an additive such as a coupling agent, a plasticizer, a UV stabilizing agent and an antioxidant so as to improve the mechanical and adhesive strengths without influencing the desired effects.

A method of forming an adhesive layer using the adhesive composition is not particularly limited. For example, an adhesive composition may be properly selected according to the fact that each adhesive layer includes the moisture-absorbent filler, and an adhesive layer may be formed using a method of coating and drying a coating solution including the adhesive composition. A stacking structure of the adhesive layers may be formed by forming separate adhesive layers and stacking the formed adhesive layers, or coating and drying another adhesive composition on an already-formed adhesive layer.

the coating of the adhesive composition as used herein may be performed on a proper processed substrate, for example, a released surface of a release substrate.

The adhesive composition may be prepared in the form of a coating solution by selecting suitable components and dissolving or dispersing the components in a suitable solvent, as necessary. In this procedure, the content of the epoxy resin included in the coating solution may be properly controlled according to the desired moisture barrier property and film moldability. Also, when the binder resin is included in the coating solution, the content of the binder resin may also be adjusted in consideration of the film moldability and impact resistance. In this procedure, when the content of the solvent included in the coating solution is too high, a drying time may be increased, and thus the minimum amount of solvent should be used.

Also, when the filler is included in the coating solution, a ball mill, a bead mill, a three-roll mill, or a high-speed grinder may be used alone or in combination in order to improve dispersability. A material of a ball or bead includes glass, alumina, or zirconium. For good particle dispersability, the material of the ball or bead may be zirconium.

Kinds of solvents used to prepare a coating solution are not particularly limited. However, when a drying time of the solvent is excessively long or the solvent is dried at a high temperature, the workability or the durability of an adhesive film may be degraded. Thus, a solvent having a volatilization temperature of 100° C. or lower may be used. Also, a small amount of a solvent having a volatilization temperature higher than this volatilization temperature range may be mixed and used in consideration of the film moldability. Examples of the solvent may include, but are not limited to, methyl ethyl ketone (MEK), acetone, toluene, dimethylformamide (DMF), methyl cellosolve (MCS), tetrahydrofuran (THF), and N-methylpyrrolidinone (NMP), which may be used alone or in combination.

A method of applying the above-described coating solution is not particularly limited. For example, a known method such as knife coating, roll coating, spray coating, gravure coating, curtain coating, comma coating or lip coating may be used without limitation.

The coated coating solution may be dried to form an adhesive layer. In this procedure, the adhesive layer may be formed by heating the coated coating solution to dry or remove the solvent. In this case, the drying conditions are not particularly limited. For example, the drying may be performed at a temperature of 70° C. to 150° C. for 1 minutes to 10 minutes.

Figure 5:
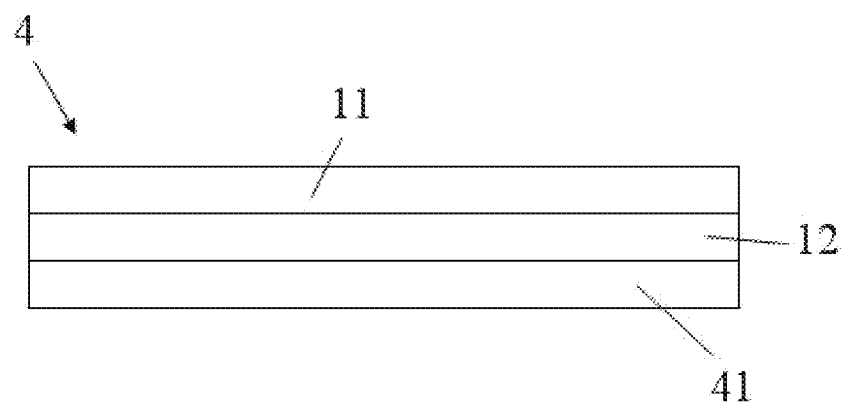
FIGS. 5 and 6 are diagrams showing another illustrative adhesive film.

The adhesive film may have a structure in which the adhesive layer is formed on a suitable base film or release film (hereinafter referred to as a "first film"). FIG. 5 is a schematic diagram showing the first and second adhesive layers 11 and 12 being formed on the base or release film 41.

Figure 6:
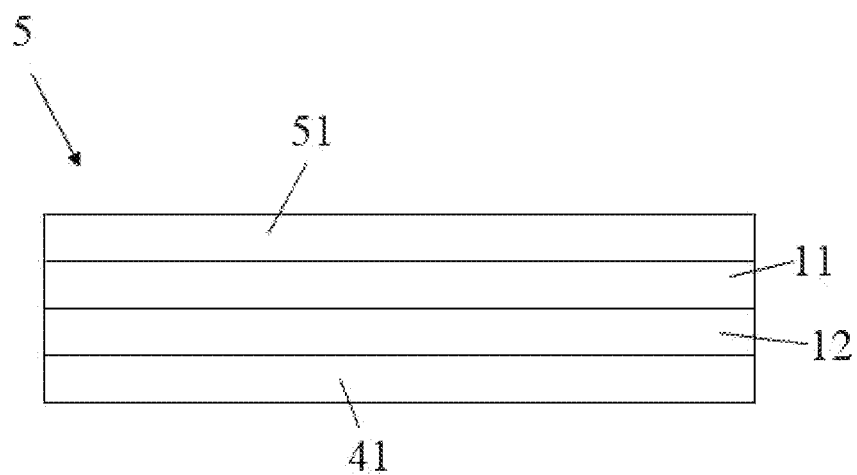

Also, the adhesive film may further include a base film or release film formed on the adhesive layer (hereinafter referred to as a "second film"). FIG. 6 is a schematic diagram showing the first and second adhesive layers 11 and 12 being formed between two base or release films 41 and 51.

As shown in FIGS. 5 and 6, the adhesive film may include an adhesive layer formed on the base film or the release film or formed between the base film and the release film. However, the adhesive films as shown in FIGS. 5 and 6 are just one exemplary embodiment. For example, the adhesive film has a structure in which only an adhesive layer which is maintained in a solid or semi-solid state at room temperature is included without a support base. As necessary, adhesive layers may be formed on both surfaces of one base film or release film to form a double-sided adhesive film.

Specific kinds of the first film are not particularly limited. For example, a typical polymer film known in the related art may be used as the first film. For example, the base or release film that may be used herein may include a polyethylene terephthalate film, a polytetrafluoroethylene film, a polyethylene film, a polypropylene film, a polybutene film, a polybutadiene film, a vinyl chloride copolymer film, a polyurethane film, an ethylene-vinyl acetate film, an ethylene-propylene copolymer film, an ethylene-ethyl acrylate copolymer film, an ethylene-methyl acrylate copolymer film, or a polyimide film. Also, one or both surfaces of the base film or release film may be subjected to proper release treatment. Examples of the release agent used for release treatment of a base film may include an alkyd-based release agent, a silicon-based release agent, a fluorine-based release agent, an unsaturated ester-based release agent, a polyolefin-based release agent, or a wax-based release agent. Among theses, the alkyd-based, silicon-based or fluorine-based release agent may be used for heat resistance, but the present invention is not limited thereto.

Also, the kind of the second film (hereinafter referred to as a "cover film") is not particularly limited. For example, the same kind as the first film or a different kind may be used as the second film as long as it falls within a category of the above-described first film. Also, the second film may also be subjected to proper release treatment.

The thickness of the above-described base film or release film is not particularly limited and may be properly selected according to applications. For example, the thickness of the first film may be in a range of approximately 50 μm to 500 μm, or approximately 100 μm to 200 μm. When the thickness of the base film or release film is less than 50 μm, it is difficult to automate a method of manufacturing a panel. On the other hand, when the thickness of the base film or release film exceeds 500 μm, the economic efficiency may be lowered.

Also, the thickness of the second film may be, for example, set to the same level as the first film. In consideration of processability, the second film may also be set to have a relatively smaller thickness than the first film.

Still another exemplary embodiment of the present invention is directed to providing an organic electronic device. The exemplary organic electronic device may include an organic electronic device encapsulated with the adhesive film. According to one exemplary embodiment, the second adhesive layer, that is, an adhesive layer which does not include the moisture-absorbent filler in the adhesive film, may be present in a state in which the second adhesive layer is attached to the entire surface of the organic electronic device. Also, the first adhesive layer, that is, an adhesive layer including the moisture-absorbent filler, may be present in a position in which the first adhesive layer does not come in contact with the organic electronic device.

According to one exemplary embodiment, the organic electronic device may include a substrate and an organic electronic device formed on the substrate. Here, the organic electronic device may be encapsulated with the adhesive film. The organic electronic device may further include a cover substrate formed thereon.

For example, the organic electronic device may be an organic light emitting diode.

The adhesive film may serve as a structural adhesive, which is configured to fix and support the substrate and the cover substrate and has excellent moisture barrier characteristics and superior optical characteristics, thereby providing an encapsulation layer.

Also, the adhesive film shows excellent transparency, and thus may effectively apply to devices designed in a top-emission or bottom-emission mode.

In addition, the use of the adhesive film makes it possible to reduce an amount of a getter and an etching material (i.e., a metal can or a glass can) used, compared with a conventional process. Therefore, a manufacturing process may be simplified and production cost may be lowered. Also, the adhesive film may be used regardless of whether devices are designed in a top-emission or bottom-emission mode, and a finally manufactured organic light emitting display device may be provided with excellent durability.

Figure 7:
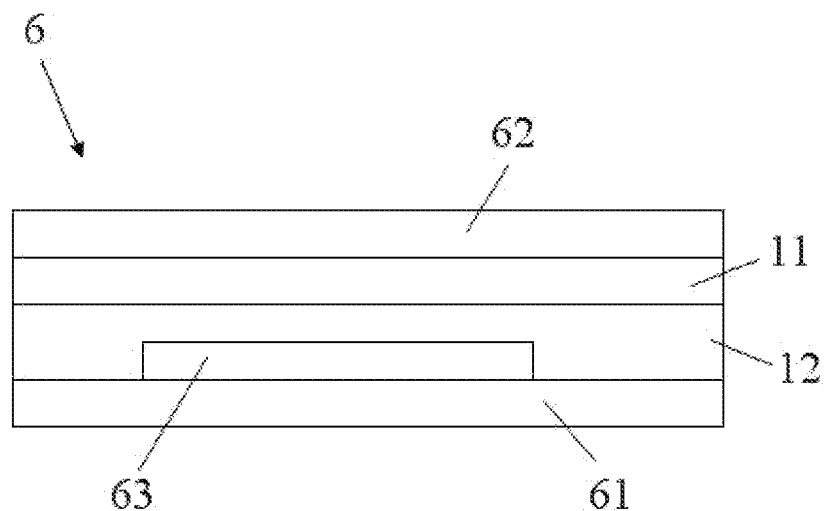
FIG. 7 is a diagram showing one illustrative organic electronic device.

FIG. 7 is a diagram showing one exemplary embodiment of the organic electronic device.

To manufacture an organic electronic device, for example, a transparent electrode is first formed on a glass or polymer film 61 used as the substrate using a method such as vacuum deposition or sputtering, and an organic electronic device 63, for example, an organic light emitting diode layer including a hole transfer layer, a light emitting layer and an electron transfer layer, is formed on the transparent electrode. Thereafter, an electrode layer is further formed on the formed organic electronic device 63. An encapsulation layer may be formed by laminating an adhesive film including the first adhesive layer 11 and the second adhesive layer 12 onto the organic electronic device 63 of the substrate 61 undergoing the above-described process.

A method of forming the encapsulation layer is not particularly limited. For example, the encapsulation layer may be manufactured using a method including applying the second adhesive layer of the above-described adhesive film to the substrate having the organic electronic device formed thereon so that second adhesive layer can be attached to the entire surface of the organic electronic device, and curing the adhesive film.

The application of the adhesive film to the organic electronic device may be performed using a method of hot-roll laminating, hot pressing, or vacuum pressing an adhesive film, but the present invention is not particularly limited thereto. The application of the adhesive film to the organic electronic device may be performed at a temperature of 50° C. to 100° C., and the curing of the adhesive film may be performed by heating the adhesive film at a temperature of 70° C. to 110° C. or irradiating the adhesive film with UV rays. Also, the method may further include bringing the adhesive film into contact with an additional encapsulation material such as glass or a metal.

For example, a cover substrate (for example, glass or a polymer film) 62 to which the above-described adhesive layer is transferred in advance is laminated on the organic electronic device 63 formed on the substrate 61, heated and pressed against the organic electronic device 63. Next, when the adhesive layer is transferred onto the cover substrate 62, for example, the above-described adhesive film may be used to peel the base or release film formed on the film. Then, the adhesive layer may be transferred while being heated using a vacuum press or a vacuum laminator. In this procedure, when the adhesive is a thermosetting adhesive, a curing reaction may be excessively carried out, which leads to a decrease in close adhesive strength or adhesion of an encapsulating material. As a result, the process temperature and the process time should be controlled within ranges of approximately 100° C. and 5 minutes. Then, the cover substrate 62 to which the adhesive layer is transferred is heated and pressed against the organic electronic device. In this case, the transfer process may be performed using a vacuum press or a vacuum laminator. In this procedure, the adhesive layer may be melted to show pressure-sensitive adhesivity.

Thereafter, an encapsulation layer may be formed by subjecting the adhesive film to an additional curing process. This curing process may be, for example, performed in a heating chamber or a UV chamber. In the curing process, the heating conditions or electromagnetic wave-irradiating conditions may be properly selected in consideration of the stability of the organic electronic device and the curability of a resin.

However, the above-described manufacturing method is just one way to manufacture an organic electronic device. As a result, the process sequence and the process conditions may be optionally changed. For example, the sequence of the pressing and encapsulation processes may be changed. That is, the adhesive film may be transferred to the organic electronic device 63 formed on the substrate 61, and the cover substrate 62 may be pressed against the organic electronic device 63.

Hereinafter, Examples which fall within the scope of the present invention and Comparative Examples which do not fall within the scope of the present invention will be described in detail. However, it should be understood that the Examples and Comparative Examples are not intended to limit the scope of the present invention.

Example 1

1. Preparation of Solution for First Adhesive Layer

A solution (having a solid content of 20%) including CaO (having an average particle size of less than 5 µm) as a moisture absorbent was prepared. Then, the solution was dispersed to homogeneously distribute the CaO. In a separate procedure, a solution (having a solid content of 70%) in which 100 g of an epoxy resin (YD-128, KukDo Chemical Co., Ltd.) and 70 g of a phenoxy resin (YP-70, Tohto Kasei Co., Ltd.) were diluted with methyl ethyl ketone was prepared and then homogenized. 250 g of the previously prepared CaO solution was added to the homogenized solution, and 5 g of a curing agent, imidazole (Shikoku Chemicals Corp.), was added thereto. Then, the resulting mixture was stirred at a high rotary speed for one hour to prepare a solution for a first adhesive layer.

2. Preparation of Solution for Second Adhesive Layer

A solution (having a solid content of 70%) in which 100 g of an epoxy resin (YD-128, KukDo Chemical Co., Ltd.) and 90 g of a phenoxy resin (YP-70, Tohto Kasei Co., Ltd.) were diluted with methyl ethyl ketone was prepared and then homogenized. 5 g of a curing agent, imidazole (Shikoku Chemicals Corp.), was added to the solution, and the resulting mixture was stirred at a high rotary speed for one hour to prepare a solution for a second adhesive layer.

3. Manufacture of Adhesive Film

The previously prepared solution for a first adhesive layer was coated on a released surface of a release PET film using a comma coater and dried at 130° C. for 3 minutes in a drying oven to form a first adhesive layer having a thickness of 50 µm.

The previously prepared solution for a second adhesive layer was coated on a released surface of a release PET film using a comma coater and dried at 130° C. for 3 minutes in a drying oven to form a second adhesive layer having a thickness of 5 µm.

The first adhesive layer and the second adhesive layer were stacked together to manufacture a multi-layered adhesive film (thickness ratio T1/T2=10).

Example 2

An adhesive film (thickness ratio T1/T2=4) was manufactured in the same manner as in Example 1, except that the first adhesive layer was formed to a thickness of 40 µm and the second adhesive layer was formed to a thickness of 10 µm.

Example 3

An adhesive film (thickness ratio T1/T2=2) was manufactured in the same manner as in Example 1, except that the first adhesive layer was formed to a thickness of 30 µm and the second adhesive layer was formed to a thickness of 15 µm.

Example 4

An adhesive film (thickness ratio T1/T2=1) was manufactured in the same manner as in Example 1, except that the first adhesive layer was formed to a thickness of 15 µm and the second adhesive layer was formed to a thickness of 15 µm.

Comparative Example 1

An adhesive film (thickness ratio T1/T2=0.1) was manufactured in the same manner as in Example 1, except that the first adhesive layer was formed to a thickness of 5 µm and the second adhesive layer was formed to a thickness of 50 µm.

Comparative Example 2

An adhesive film (thickness ratio T1/T2=20) was manufactured in the same manner as in Example 1, except that the first adhesive layer was formed to a thickness of 60 µm and the second adhesive layer was formed to a thickness of 3 µm.

Comparative Example 3

An adhesive film (thickness ratio T1/T2=10) was manufactured in the same manner as in Example 1, except that the first adhesive layer was formed to a thickness of 20 µm and the second adhesive layer was formed to a thickness of 2 µm.

Comparative Example 4

An adhesive film (thickness ratio T1/T2=5) was manufactured in the same manner as in Example 1, except that the first adhesive layer was formed to a thickness of 100 µm and the second adhesive layer was formed to a thickness of 20 µnm.

Comparative Example 5

An adhesive film was manufactured in the same manner as in Example 1, except that the adhesive film was formed to a thickness of 45 µm using only the first adhesive layer prepared in Example 1.

Comparative Example 6

An adhesive film was manufactured in the same manner as in Example 1, except that the adhesive film was formed to a thickness of 45 µm using only the second adhesive layer prepared in Example 1.

Comparative Example 7

An adhesive film was manufactured in the same manner as in Example 1, except that 20 g of a phenoxy resin was used in the solution for a second adhesive layer prepared in Example 1.

Experimental Example 1

Confirmation of Moisture Barrier Characteristics

To examine the moisture barrier characteristics of the adhesive films manufactured in Examples 1 to 4 and Comparative Examples 1 to 7, calcium tests were performed. More particularly, calcium (Ca) was deposited in 9 spots, each of which had a size of 5 mm×5 mm and a thickness of 100 nm, on a lower glass panel having a size of 100 mm×100 mm. Separately, each of the adhesive films prepared in Examples 1 to 4 and Comparative Examples 1 to 7 was heated at 80° C. for one minute and laminated onto an upper glass panel having a size of 17 mm×17 mm as shown in FIG. 4. Thereafter, the adhesive film laminated onto the upper glass panel was heated in the same manner as described above and laminated onto the lower glass panel under a vacuum condition (less than 100 mTorr). Subsequently, the laminated upper/lower glass panels were cured at 100° C. for 3 hours in a high-temperature drying oven and the resulting test samples were kept at a temperature of 85° C. and 85% R.H. for 1,000 hours in a constant temperature/humidity chamber. Then, a time required to cope with a bezel having a thickness of 6 mm was evaluated to be a point of time when calcium became transparent by an oxidation reaction caused by penetration of moisture. The results are listed in the following Table 1.

TABLE 1

|  | high temperature/humidity 6 mm 1,000 hours - calcium test |
|---|---|
| Example 1 | calcium Good |
| Example 2 | calcium Good |
| Example 3 | calcium Good |
| Example 4 | calcium Good |
| Comparative Example 1 | Less than 200 hours |

TABLE 1-continued

|  | high temperature/humidity 6 mm 1,000 hours - calcium test |
| --- | --- |
| Comparative Example 2 | calcium Good |
| Comparative Example 3 | calcium Good |
| Comparative Example 4 | calcium Good |
| Comparative Example 5 | calcium Good |
| Comparative Example 6 | Less than 100 hours |
| Comparative Example 7 | calcium Good |

Experimental Example 2

Confirmation of Damage of Organic Electronic Device 3-inch-long organic light emitting panels were manufactured using the adhesive films prepared in Examples 1 to 4 and Comparative Examples 1 to 7, and kept at a temperature of 85° C. and 85% R.H. for 1,000 hours in a constant temperature/humidity chamber. Then, the damage of the organic devices was checked using an optical microscope. The results are listed in the following Table 2 (provided that the damage caused by moisture penetration was disregarded).

TABLE 2

|  | Damage |
| --- | --- |
| Example 1 | Good |
| Example 2 | Good |
| Example 3 | Good |
| Example 4 | Good |
| Comparative Example 1 | Good |
| Comparative Example 2 | Damaged |
| Comparative Example 3 | Damaged |
| Comparative Example 4 | Good |
| Comparative Example 5 | Damaged |
| Comparative Example 6 | Good |
| Comparative Example 7 | Good |

Figure 8:
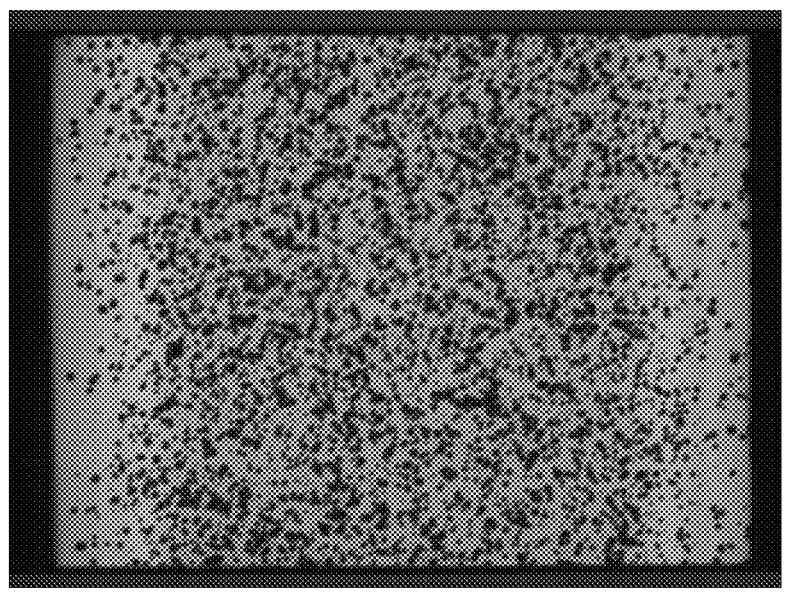
FIG. 8 is an optical microscopic image taken after an organic light emitting panel manufactured using an adhesive film manufactured in Comparative Example 3 is kept at a temperature of 85° C. and a relative humidity (R.H.) of 85% for 1,000 hours in a constant temperature/humidity chamber.

Also, a 3-inch-long organic light emitting panel manufactured using the adhesive film prepared in Comparative Example 3 was kept at a temperature of 85° C. and 85% R.H. for 1,000 hours in a constant temperature/humidity chamber. An optical microscopic image taken at this time is shown in FIG. 8. Referring to FIG. 8, it can be seen that, since the underlying second adhesive layer had a very small thickness, dark spots were formed due to physical damage to the device caused when the device was pressed by the moisture-absorbent filler included in the first adhesive layer or particles flowing in during a lamination process, and chemical damage to the device by materials generated by a reaction with moisture.

Figure 9:
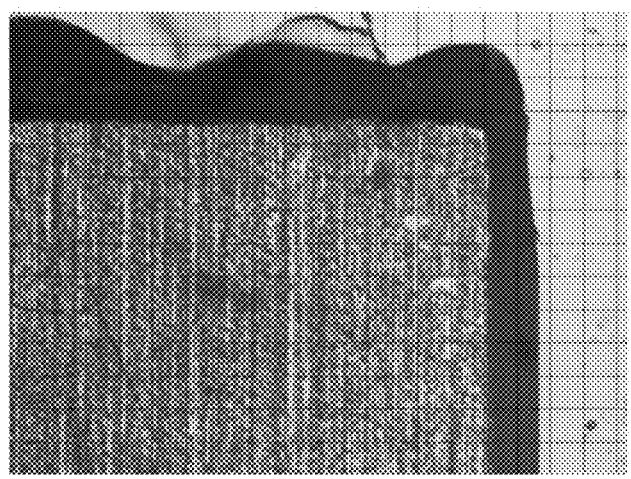
FIG. 9 is an optical microscopic image taken when a lamination process is simulated using an adhesive film manufactured in Comparative Example 4.

In addition, an optical microscopic image taken when a lamination process was simulated using the adhesive film manufactured in Comparative Example 4 is shown in FIG. 9. Referring to FIG. 9, it can be seen that a lamination property was degraded upon manufacture of a panel since the entire thickness of the adhesive layer did not fall within the predetermined range. That is, it can be seen that the adhesive exuded and effected processability during the lamination process.

Experimental Example 3

Measurement of Difference in Viscosity Between Layers

The viscosities of the first adhesive layer and the second adhesive layer of the adhesive film manufactured in Example 1 and Comparative Example 7 were measured using an ARES. The viscosities at 80° C. and the differences in viscosities of the first and second adhesive layers are listed in the following Table 3.

TABLE 3

|  | Viscosity of first adhesive layer (Pa·s, at 80° C.) | Viscosity of second adhesive layer (Pa·s, at 80° C.) | Difference in viscosity between layers (Pa·s, at 80° C.) |
| --- | --- | --- | --- |
| Example 1 | 2,324 | 2,349 | 25 |
| Comparative Example 7 | 2,324 | 2,054 | 270 |

As listed in Table 3, it can be seen that the adhesive films manufactured in Examples 1 to 4 according to the exemplary embodiments of the present invention may be effectively used to encapsulate an organic electronic device so as to prevent penetration of moisture into the organic electronic device, but may not be effectively used to encapsulate the organic electronic device when the thickness ratio is not satisfied, the absolute thickness is too small, or the sum of the thicknesses is too large.

What is claimed is:

1. An adhesive film for encapsulating an entire surface of an organic electronic device, comprising:
    a first adhesive layer comprising a moisture-absorbent filler; and
    a second adhesive layer which does not comprise the moisture-absorbent filler, the second adhesive layer being in contact with the first adhesive layer, wherein a ratio T1/T2 of a thickness T2 of the second adhesive layer to a thickness T1 of the first adhesive layer is in the range from 1.0 to 10,
    wherein the first and second adhesive layers are sequentially stacked one upon the other, and
    wherein a difference in viscosity between the first adhesive layer and the second adhesive layer at any one temperature point in the range of 30° C. to 130° C. is 100 Pa·s or less when the first adhesive layer and the second adhesive layer are in an uncured state.

2. The adhesive film of claim 1, wherein the first adhesive layer has a thickness T1 of 5 μm to 100 μm.

3. The adhesive film of claim 1, wherein the second adhesive layer has a thickness T2 of 3 μm to 20 μm.

4. The adhesive film of claim 1, wherein the adhesive film further comprises one or more adhesive layers comprising a moisture-absorbent filler or one or more adhesive layers which do not comprise the moisture-absorbent filler,
    wherein a ratio T4/T3 of the sum T3 of thicknesses of the adhesive layers which do not comprise the moisture-absorbent filler to the sum T4 of thicknesses of the adhesive layers comprising the moisture-absorbent filler is in the range from 1 to 10.

5. The adhesive film of claim 4, wherein an adhesive layer which does not comprise the moisture-absorbent filler is arranged on the lowermost portion of a multi-layered adhesive layer.

6. The adhesive film of claim 4, wherein the adhesive layers which do not comprise the moisture-absorbent filler are arranged on the lowermost and uppermost portions of a multi-layered adhesive layer, respectively.

7. The adhesive film of claim 1, wherein the first adhesive layer or the second adhesive layer has a viscosity at room temperature of $10^6$ Pa·s or more.

8. The adhesive film of claim 1, wherein a total thickness of the first and the second adhesive layers is 100 μm or less.

9. The adhesive film of claim 1, wherein the first adhesive layer or the second adhesive layer comprises a curable resin, and the curable resin is a thermosetting resin, a photocurable resin or a dual-curable resin.

10. The adhesive film of claim 9, wherein the curable resin comprises at least one curable functional group selected from the group consisting of a glycidyl group, a hydroxyl group, an isocyanate group, a carboxyl group, an amide group, an epoxide group, a cyclic ether group, a sulfide group, an acetal group and a lactone group.

11. The adhesive film of claim 1, wherein the moisture-absorbent filler is a reactive moisture absorbent selected from the group consisting of alumina, a metal oxide, a metal salt and phosphorus pentoxide.

12. The adhesive film of claim 1, wherein the moisture-absorbent filler is at least one selected from the group consisting of $P_2O_5$, $Li_2O$, $Na_2O$, $BaO$, $CaO$, $MgO$, $Li_2SO_4$, $Na_2SO_4$, $CaSO_4$, $MgSO_4$, $CoSO_4$, $Ga_2(SO_4)_3$, $Ti(SO_4)_2$, $NiSO_4$, $CaCl_2$, $MgCl_2$, $SrCl_2$, $YCl_3$, $CuCl_2$, $CsF$, $TaF_5$, $NbF_5$, $LiBr$, $CaBr_2$, $CeBr_3$, $SeBr_4$, $VBr_3$, $MgBr_2$, $BaI_2$, $MgI_2$, $Ba(ClO_4)_2$ and $Mg(ClO_4)_2$.

13. The adhesive film of claim 1, wherein the first adhesive layer comprises the moisture-absorbent filler at a content of 5 to 50 parts by weight, relative to 100 parts by weight of the curable resin.

14. The adhesive film of claim 1, wherein the first adhesive layer or the second adhesive layer further comprises a filler.

15. The adhesive film of claim 14, wherein the filler is at least one selected from the group consisting of clay, talc, silica, barium sulfate, aluminum hydroxide, calcium carbonate, magnesium carbonate, zeolite, zirconia, titania and montmorillonite.

16. The adhesive film of claim 14, wherein the adhesive layer comprises the filler at a content of 3 to 50 parts by weight, relative to 100 parts by weight of the curable resin.

17. The adhesive film of claim 1, wherein the first adhesive layer or the second adhesive layer further comprises a curing agent.

18. The adhesive film of claim 17, wherein the curing agent is selected from the group consisting of an amine-based compound, an imidazole-based compound, a phenol-based compound, a phosphorus-based compound and an acid anhydride-based compound.

19. The adhesive film of claim 17, wherein the adhesive layer comprises the curing agent at a content of 1 to 10 parts by weight, relative to 100 parts by weight of the curable resin.

20. The adhesive film of claim 1, wherein the first adhesive layer or the second adhesive layer further comprises a binder resin.

21. An organic electronic device, comprising:
a substrate;
an organic electronic diode formed on the substrate; and
the adhesive film according to claim 1 to encapsulate the organic electronic diode,
wherein a second adhesive layer of the adhesive film which does not comprise a moisture-absorbent filler is attached to an entire surface of the organic electronic diode.

22. The organic electronic device of claim 21, wherein the organic electronic diode is an organic light emitting diode.

* * * * *